(12) United States Patent
Serizawa et al.

(10) Patent No.: US 10,852,276 B2
(45) Date of Patent: Dec. 1, 2020

(54) HOLISTIC SENSING METHOD AND SYSTEM

(71) Applicant: Hitachi, Ltd., Tokyo (JP)

(72) Inventors: Yasutaka Serizawa, Cupertino, CA (US); Sudhanshu Gaur, Santa Clara, CA (US); Yusuke Shomura, Los Gatos, CA (US)

(73) Assignee: Hitachi, Ltd., Tokyo (JP)

( * ) Notice: Subject to any disclaimer, the term of this patent is extended or adjusted under 35 U.S.C. 154(b) by 129 days.

(21) Appl. No.: 16/166,596

(22) Filed: Oct. 22, 2018

(65) Prior Publication Data

US 2020/0124572 A1 Apr. 23, 2020

(51) Int. Cl.
| | | |
|---|---|---|
| *G01R 33/00* | (2006.01) | |
| *H04R 1/40* | (2006.01) | |
| *H04R 3/00* | (2006.01) | |
| *G01N 29/14* | (2006.01) | |

(52) U.S. Cl.
CPC ......... *G01N 29/14* (2013.01); *G01R 33/0035* (2013.01); *H04R 1/406* (2013.01); *H04R 3/005* (2013.01); *H04R 2201/401* (2013.01); *H04R 2203/12* (2013.01)

(58) Field of Classification Search
CPC .... H04R 1/406; H04R 3/005; H04R 2203/12; H04R 2201/401; G01R 33/0035; G01N 29/14

USPC .......................................................... 73/587
See application file for complete search history.

(56) References Cited

U.S. PATENT DOCUMENTS

| | | | |
|---|---|---|---|
| 2007/0230269 A1* | 10/2007 | Ledeczi | G01S 5/22 367/117 |
| 2013/0156198 A1 | 6/2013 | Kim et al. | |
| 2013/0190965 A1* | 7/2013 | Einecke | G06K 9/00664 701/28 |
| 2014/0019522 A1* | 1/2014 | Weng | G06F 16/903 709/203 |
| 2015/0300874 A1* | 10/2015 | Al-Walaie | G01H 9/004 73/655 |
| 2017/0065230 A1* | 3/2017 | Sinha | A61B 5/0077 |
| 2017/0076156 A1* | 3/2017 | Borel | G11B 27/28 |
| 2017/0318360 A1* | 11/2017 | Tran | A63F 13/245 |
| 2018/0074162 A1 | 3/2018 | Jones et al. | |
| 2018/0310780 A1* | 11/2018 | Mahaffey | A47K 5/12 |

OTHER PUBLICATIONS

Extended European Search Report for related European Application No. 19204073.1 dated Jan. 30, 2020; 10 pages.

* cited by examiner

*Primary Examiner* — Jacques M Saint Surin
(74) *Attorney, Agent, or Firm* — Procopio, Cory, Hargreaves & Savitch LLP

(57) ABSTRACT

Systems and methods described herein are directed to a specialized Internet of Things (IoT) device deploying both acoustic and radio wave signals. In example implementations described herein, camera data and acoustic sensor data is integrated to generate an acoustic sensor heatmap for the holistic sensing systems in an IoT area.

18 Claims, 14 Drawing Sheets

Distance vector table

| ID | 1 | 2 | 3 | 4 | 5 | 6 | 7 | 8 | 9 | 10 |
|---|---|---|---|---|---|---|---|---|---|---|
| 1 | | | | | | | | | | |
| 2 | N/A | | | | | | | | | |
| 3 | (-5,0,0) | N/A | | | | | | | | |
| 4 | N/A | N/A | (-1,5,0) | | | | | | | |
| 5 | N/A | N/A | N/A | (5,-5,0) | | | | | | |
| 6 | N/A | N/A | (5,-1,0) | (7,7,0) | N/A | | | | | |
| 7 | N/A | N/A | N/A | (10,2,0) | (5,5,0) | (4,-4,0) | | | | |
| 8 | N/A | N/A | N/A | N/A | N/A | (7,6,0) | N/A | | | |
| 9 | N/A | N/A | N/A | N/A | N/A | N/A | N/A | N/A | | |
| 10 | N/A | N/A | N/A | N/A | N/A | N/A | (5,-11,0) | N/A | N/A | |

HOLISTIC SENSING METHOD AND SYSTEM

BACKGROUND

Field

The present disclosure is directed to Internet of Things (IoT) systems, and more specifically, to IoT systems as applied to industrial areas.

Related Art

For industrial IoT areas, such as smart manufacturing, IoT approaches have been proposed in the related art for the purposes of increasing productivity, for determining subsequent courses of action at the executive and/or the shop floor level, for determining methods to increase value of products and services, and for increasing the return of on asset.

For example, the related art IoT approaches attempt to utilize shop floor visualization predictive/preventive maintenance dynamic scheduling, product lifecycle management (PLM) collaboration, and end to end (E2E) value chain collaboration.

SUMMARY

Improving productivity is a common unmet goal for the industrial IoT field. Various types of verifications have been conducted to ascertain increasing productivity on the factory shop floor with not only holistic sensing approaches, but also specific sensing approaches. Holistic sensing is a type of sensing in which non-contact or non-localized types of sensors (e.g., cameras, ultrasound, acoustic, etc.) are utilized for detection, whereas specific sensing is a type of sensing in which contact or localized types of sensors (e.g., temperature/humidity sensors, vibration sensors, proximity sensors, etc.) are utilized. The two types of sensing methods are mutually complementary.

The shop floor of the industrial factory can be very wide. Thus, at the first step a holistic sensing method may be effective to detect abnormal situations, machines, and humans, and then specific sensing method enables closer investigation of the essential causality in detail. This sensing process (drilldown process) provides important information for reducing downtime of production, which leads to increasing productivity.

Related art approaches to holistic sensing include monitoring systems using camera, which facilitate applications such as, production line failure monitoring, operator flow line analysis, product quality check, and so on. However, the camera image information in related art approaches is typically inadequate for such applications.

In the present disclosure, acoustic sensors such as microphones are utilized to complement the camera data. In an example implementation, correspondence relationships between camera pixels and acoustic sensor data are determined to investigate the shop floor in detail that complement the camera data. To satisfy the requirement for increasing productivity, the holistic sensing methods and systems disclosed herein provide a sensor data fusion of camera and acoustic data. Further, to overlay the camera and acoustic sensor data, example implementations automatically capture acoustic sensor heatmaps.

Aspects of the present disclosure include a device configured to calculate direction of arrival (DOA) of acoustic waves and facilitate beamforming functionalities, involving an array of acoustic sensors configured to detect acoustic wave signals; a 3-dimensional magnetometer; an antenna configured to transmit and receive radio wave signals; an acoustic speaker configured to transmit acoustic wave signals; and a processor, configured to simultaneously transmit an acoustic wave signal from the acoustic speaker and a radio wave signal from the antenna; detect another acoustic wave signal from the array of acoustic sensors and another radio wave signals from the antenna; and transmit, to a gateway, information regarding the detected another acoustic wave signal and the detected another radio wave signal, and measurements from the 3-dimensional magnetometer.

Aspects of the present disclosure include a device configured to calculate direction of arrival (DOA) of acoustic waves and facilitate beamforming functionalities, involving acoustic wave signals detection means; 3-dimensional magnetometer means; radio wave signals transmission and receiving means; acoustic wave signal transmission means; means for simultaneously transmitting an acoustic wave signal from the acoustic wave signal transmission means and a radio wave signal from the radio wave signals transmission means; and means for transmitting information regarding the detected another acoustic wave signal and the detected another radio wave signal, and measurements from the 3-dimensional magnetometer means.

Aspects of the present disclosure further include a system, involving a plurality of devices configured to calculate direction of arrival (DOA) of acoustic waves and facilitate beamforming functionalities; and a server configured to interact with the plurality of devices. The server can involve a processor configured to transmit a command to the plurality of devices to simultaneously broadcast an acoustic wave signal and a radio wave signal; receive information regarding detected acoustic wave signals and detected radio wave signals, and 3-dimensional magnetometer measurements from each of the plurality of devices; and for the information indicative of each of the plurality of devices having at least one acoustic connection with another one of the plurality of devices, determine a position for each of the plurality of devices.

Aspects of the present disclosure further include a method, involving transmitting a command to the plurality of devices to simultaneously broadcast an acoustic wave signal and a radio wave signal; receiving information regarding detected acoustic wave signals and detected radio wave signals, and 3-dimensional magnetometer measurements from each of the plurality of devices; and for the information indicative of each of the plurality of devices having at least one acoustic connection with another one of the plurality of devices, determining a position for each of the plurality of devices.

Aspects of the present disclosure further include a computer program, having instructions involving transmitting a command to the plurality of devices to simultaneously broadcast an acoustic wave signal and a radio wave signal; receiving information regarding detected acoustic wave signals and detected radio wave signals, and 3-dimensional magnetometer measurements from each of the plurality of devices; and for the information indicative of each of the plurality of devices having at least one acoustic connection with another one of the plurality of devices, determining a position for each of the plurality of devices. The computer program may be stored on a non-transitory computer readable medium and executed by one or more hardware processors.

Aspects of the present disclosure further include a system involving means for transmitting a command to the plurality of devices to simultaneously broadcast an acoustic wave signal and a radio wave signal; means for receiving information regarding detected acoustic wave signals and detected radio wave signals, and 3-dimensional magnetometer measurements from each of the plurality of devices; and for the information indicative of each of the plurality of devices having at least one acoustic connection with another one of the plurality of devices, means for determining a position for each of the plurality of devices.

Aspects of the present disclosure further include a method, which can involve establishing beamforming functionality on the acoustic device as described herein using the system as described herein, the methods described herein, and the position information of assets; converting position information of assets into direction of beamforming; and facilitating acoustic condition monitoring of assets with AI or machine learning techniques.

BRIEF DESCRIPTION OF DRAWINGS

FIGS. 6(a) and 6(b) illustrate an example of collected distance vectors from the sensor devices, in accordance with an example implementation.

FIG. 13 illustrates an example of asset-image correspondence table in accordance with an example implementation.

DETAILED DESCRIPTION

Figure 1:
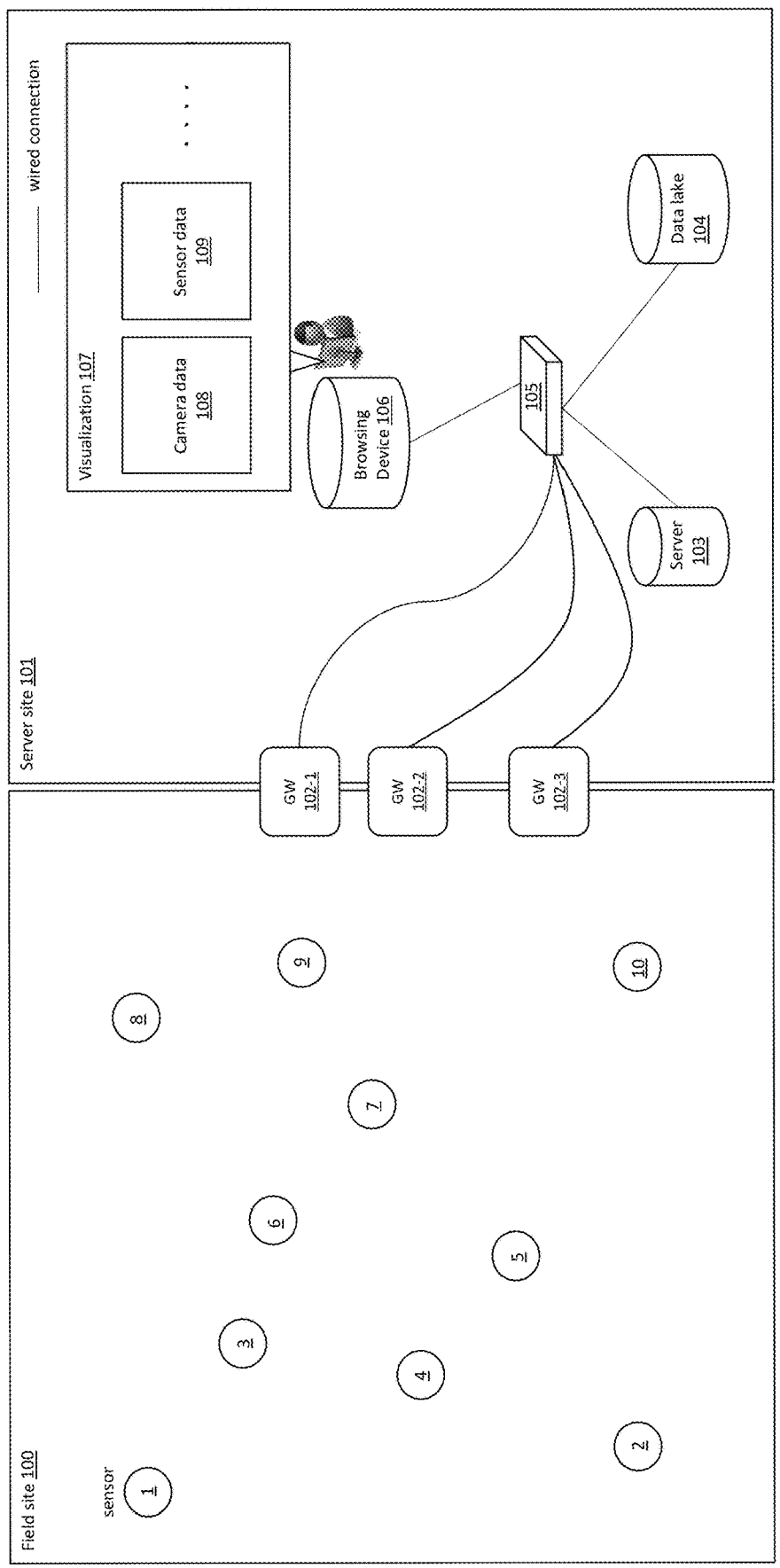
FIG. 1 illustrates an example system architecture for an industrial IoT sensing system, in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

The present disclosure is generally directed to holistic sensing systems. In example implementations described herein, camera and acoustic sensor data are integrated, and systems and methods are proposed to capture an acoustic sensor heatmap for the holistic sensing systems in the IoT area. In particular, example implementations described herein can facilitate automatic heatmap generation for indoor use cases.

The heatmap incorporates sensor position information. When the number of sensors is few in number, methods such as manual recording, beacon support with a user equipment (UE) such as a mobile device, or tapping a shop floor drawing shown on the mobile device display and registering the position/sensor identifier (ID) may work. However, once the number of sensors becomes overly large (e.g., exceeding 100) such methods may not work as the cost incurred may be too high. Therefore, example implementations described herein are directed to improving the cost for capturing an acoustic heatmap and overlaying the heatmap onto camera data in indoor use cases in which Global Positioning Satellite (GPS) system is not available (e.g., cost prohibitive, unreliable, etc.).

In an example implementation described below, systems and methods are configured to reduce manual operation to capture acoustic heatmaps with a single acoustic sensor, investigate a shop floor in detail with an acoustic sensor array, and overlay the heatmap information onto camera data.

FIG. 1 illustrates an example system architecture for an industrial IoT sensing system in both a field site 100 (e.g., shop floor) and a server site 101 (e.g., control/management center), in accordance with an example implementation. In this example, there are sensors 1-10 and IoT gateways (GWs) 102-1, 102-2, 102-3 in a field site 100, where the sensors 1-10 and GWs 102-1, 102-2, 102-3 are connected via a wireless or wired communication link. Server site 101 can include a server 103, a data lake 104, a communication switch 105 and a browsing device 106 (e.g., a personal computer). In example implementations, sensors 1-10 can include acoustic sensors and cameras to acquire acoustic signals and images from each local position. Then, the acoustic data, camera image, and other sensor information (e.g., sensor ID, accessorial sensor data) are transferred to one of the GWs 102-1, 102-2, 102-3 located on the field site 100 to facilitate the network connection to the sensors 1-10. The acoustic sensor data and camera image can be processed by main computing units configured in each sensor. Transferred data, images, and other information are stored in the data lake 104 to be processed according to the applications. For example, an application can be to overlay acoustic sensor data and camera images. Browsing device 106 can execute the applications on the data lake 104 to produce visualizations 107 on the camera data 108 and the sensor data 109.

In example implementations described herein, the visualization 107 involves providing an acoustic heatmap drawing to reduce manual costs and resources through the use of a novel sensor device independent of a GPS system. Example implementations described herein use novel methods to obtain sensor position information through using novel sensor devices to more easily facilitate the providing of an acoustic heatmap with improved productivity over related art approaches.

Figure 2:
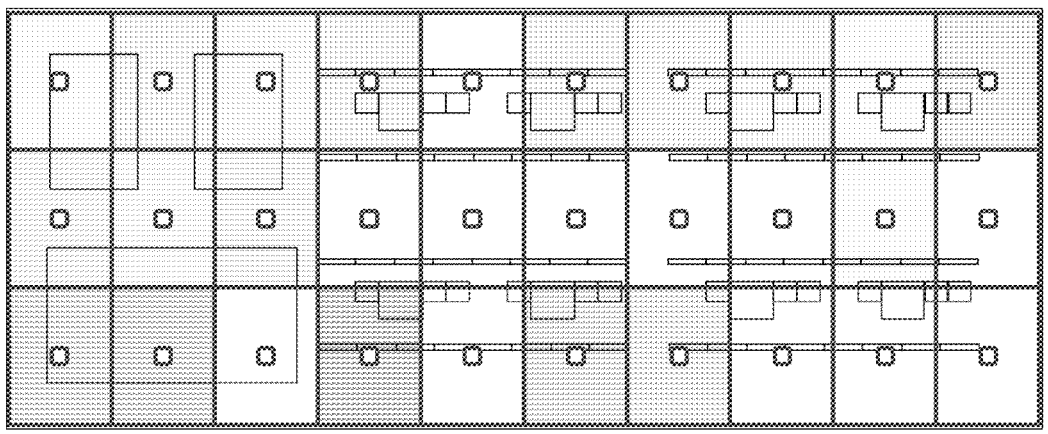
FIGS. 2 and 3 illustrate an example application of holistic sensing with acoustic sensor, in accordance with an example implementation.
Figure 3:
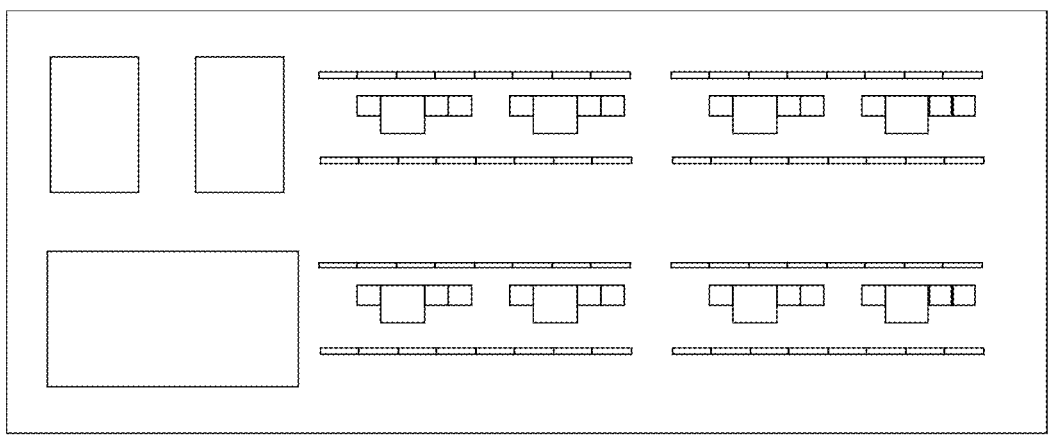

FIGS. 2 and 3 illustrate an example application of holistic sensing with an acoustic sensor, in accordance with an example implementation. FIGS. 2 and 3 illustrate an example of a drilldown analysis approach. In a default operational mode, a rough heatmap can be acquired from a single acoustic sensor that is enough to roughly search for abnormal events or machines as illustrated in the acoustic heatmap 107-1 of FIG. 2. When an abnormality (e.g., temperatures, humidity, vibrations, etc. exceed preset threshold values) is detected, a more detailed investigation can be operated with acoustic sensors array equipped in the sensor as illustrated in the acoustic heatmap 107-2 of FIG. 3. The resolution of the acoustic heatmap 107-1 in FIG. 2 is less than that of the acoustic heatmap 107-2 of FIG. 3, the latter which is derived from the beamforming capability of acoustic sensors array. As illustrated in example implementations described herein, the sensor device can be configured to calculate direction of arrival (DOA) of acoustic waves and facilitate beamforming functionalities through utilization of an acoustic sensor array as focused in particular directions to achieve spatial selectivity.

Figure 4:
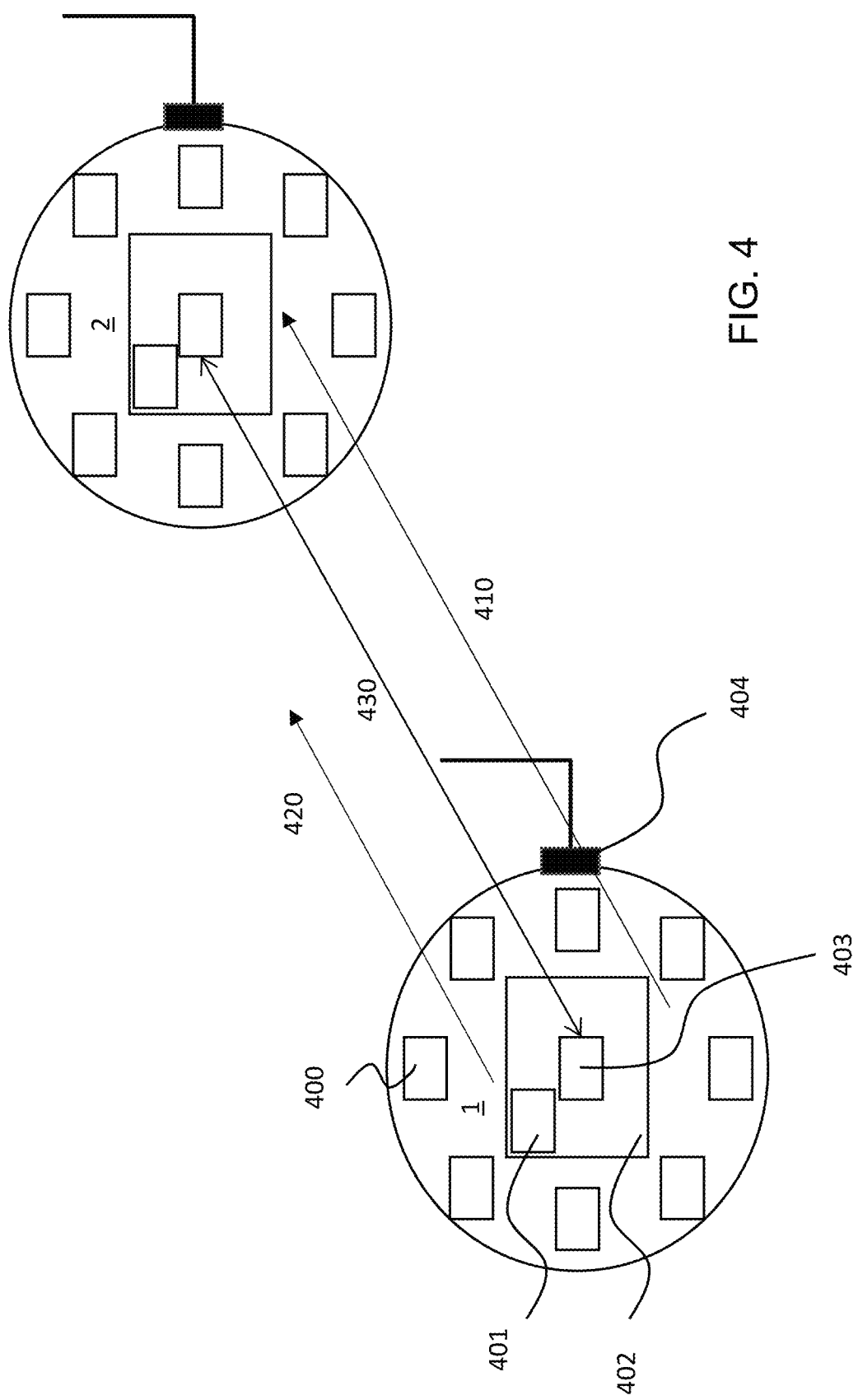
FIG. 4 shows an example element diagram of the sensor device in a field site, in accordance with an example implementation.

FIG. 4 shows an example element diagram of the sensor device in a field site, in accordance with an example implementation. Specifically, FIG. 4 illustrates an example configuration of sensor device 1 and an example interaction with sensor device 2 from FIG. 1. In an example implementation, sensor device 1 includes an acoustic sensors array 400 (e.g., an array configured with eight sensors as illustrated in FIG. 4), a 3-dimensional magnetometer/accelerometer 401 configured to detect the attitude of the sensor, a main computing/control unit (MCU) 402 made up of one or more hardware processors, a single acoustic sensor/speaker system 403 and an antenna radio 404. The sensor device 1 generates and transmits an acoustic wave signal 420 and a radio wave signal 410 through simultaneously utilizing acoustic sensor/speaker system 403 and antenna radio 404 according to the command from a server or computing device. MCU 402 can be configured to simultaneously transmit the acoustic wave signal from the acoustic sensor/speaker system 403 and the radio wave signal from the antenna 404 in response to a command received from the gateway. Such a command is transmitted from the server to the gateway and relayed to the sensor device 1 as described with respect to FIG. 5 and FIG. 7. Antenna 404 is also used to communicate with the server 103 via one of the gateways 102-1, 102-2, 102-3 and can function as a network interface (I/F) for wireless communications between the server 103 and the sensor device. Depending on the desired implementation, sensor devices can also be directly connected to the gateway 102-1, 102-2, 102-3 by a wired connection as well. Although not illustrated in FIG. 4, cameras may also be included in the sensor devices to generate camera images.

In the example of FIG. 4, sensor device 1 is transmitting to sensor device 2, which is configured to receive the acoustic wave signal 420 through its acoustic sensor array and acoustic sensor/speaker system, and receive the radio wave signal(s) 410 through its antenna. From the transmission and receipt of the acoustic wave signal and the radio wave signal, the distance 430 between the sensor devices can be derived based on the arrival time difference between the acoustic wave signal and the radio wave signal through the following equation:

$$\text{Distance} = (\text{arrival time difference between acoustic wave and radio wave}) * (\text{acoustic speed in air})$$

In an example implementation, the acoustic sensor array of sensor device 2 (as similarly configured in sensor device 1) detects the acoustic wave signal(s) to derive a direction of the detected acoustic wave through using direction of arrival (DOA) technique implemented on the MCU in accordance with the desired implementation. Through the distance equation and the DOA control technique, the MCU can thereby determine a distance and a direction to another device (distance vector) that transmitted the acoustic wave signal and the radio wave signal.

Such a process provides the relative distance vector from the sensor device 2 to sensor device 1 where sensor device 1 transmitted the acoustic wave signal and the radio wave signal. In addition to the distance vector, the sensor device 2 measures its own attitude using a 3-dimensional magnetometer and accelerometer. The accelerometer is used to measure tilt of the sensors. The 3-dimensional magnetometer is used to measure the orientation of the sensors. With the tilt and orientation values obtained from the 3-dimensional magnetometer and accelerometer, a coordinate system of all the relative distance vectors extracted from all the sensors can be maintained in a common format and frame of reference as the data processing in server 103. Once the sensor devices extract the distance vector to other sensor devices, the sensor devices can transmit the distance vector with tilt and orientation values to GWs.

Figure 5:
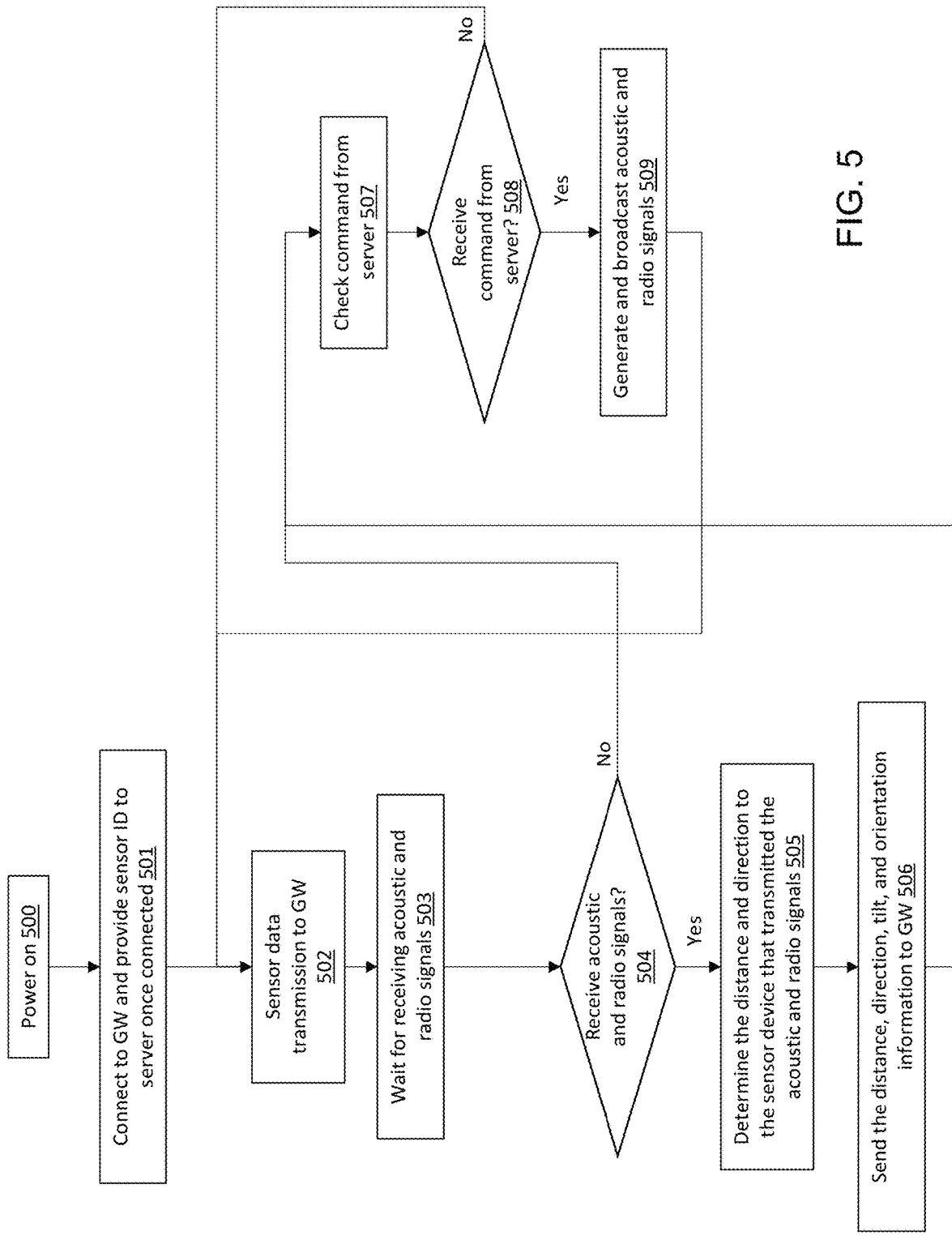
FIG. 5 illustrates an example operational flow chart of a sensor device, in accordance with an example implementation.

FIG. 5 illustrates an example operational flow chart of a sensor device, in accordance with an example implementation. The flow diagram can be executed by the MCU of the sensor device. Once the sensor device is powered on at 500, the sensor device attempts to connect to a GW with a wireless or wired communication protocol at 501.

After connecting to the GW, the sensor device sends its sensor ID via the GW to the server 103. The sensor IDs are collected by the server 103, which is used to manage the position detection procedure for the sensor devices. In an example implementation, the sensor device continues to transmit sensor data (acoustic raw data, pre-processed data, summarized data, and so on) at 502. In parallel and/or simultaneously, the sensor device also waits for receiving acoustic and radio signals at 503 by using its acoustic sensor 403, acoustic sensors array 400, and antenna radio 404. If no acoustic or radio signals are received (No), the sensor device changes its operating state to check for commands from the server 103 at 507. Otherwise (Yes), if the sensor device receives an acoustic and radio signal, the sensor device determines the distance and direction to the sensor device that transmitted the acoustic and radio signals through its MCU 402 at 505, and sends the distance, direction, tilt, and orientation data (e.g., which is derived from 3-dimensional magnetometer/accelerometer 401) information to a GW at 506.

Subsequently at 507, the sensor device changes its operating state to check for commands from the server 103. If no command is received (No) at 508, then the sensor device will change its operation mode to execute the flow at 502 and 503 to transmit sensor data. Otherwise if the sensor device receives a command (Yes) at 508 from the server 103, the sensor device generates and broadcasts acoustic and radio signals simultaneously using the acoustic speaker and the antenna radio at 509, and continues to transmit sensor data again at 502.

FIGS. 6(*a*) and 6(*b*) illustrate an example of collected distance vectors from the sensor devices, in accordance with an example implementation. In FIG. 6(*a*), acoustic connections are illustrated, which depends on the position where the sensor device is located. In the example of FIG. 6(*a*), ten acoustic connections are established across sensor devices 1, 3, 4, 5, 6, 7, 8, and 10, where the relative distance vectors are collected in server 103 as shown in FIG. 6(*b*) in detail. In FIG. 6(*b*), the distance vectors between each sensor device are implemented in an (x, y, z) form representing vector components in the Cartesian coordinate system. However, other formats can also be utilized according to the desired implementation, and the present disclosure is not limited thereto. As illustrated in FIG. 6(*b*), N/A indicates that the two corresponding sensor devices do not have a mutual acoustic connection. If a sensor device has the N/A entry in comparison with all of the other sensor devices, then it does not have an acoustic connection with other sensor devices. Accordingly, the server 103 can identify those devices that do not have an acoustic connection with other devices by referring to the distance vector table of FIG. 6(*b*).

Figure 7:
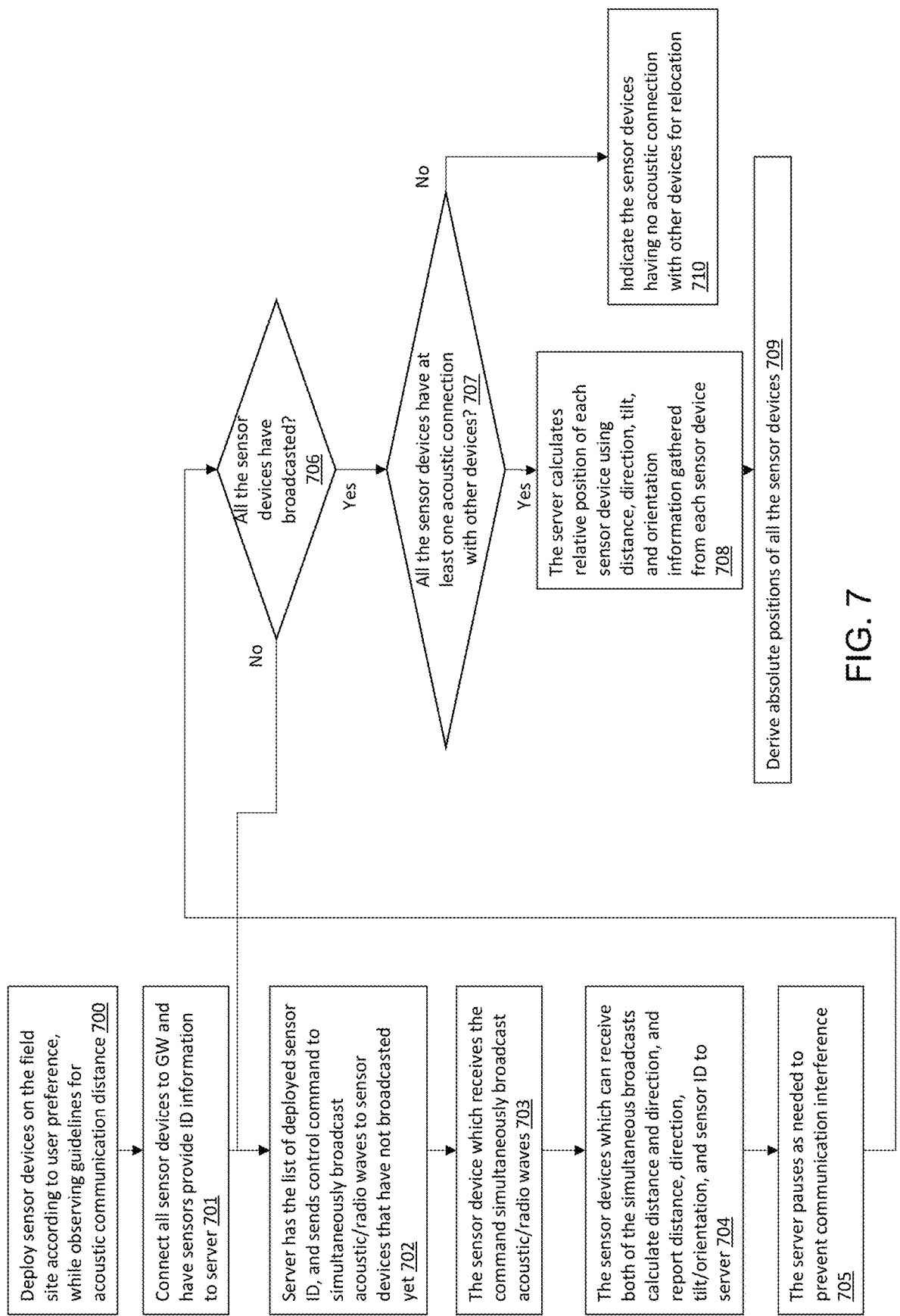
FIG. 7 illustrates an example deployment procedure of the sensor devices to acquire position information for generating an acoustic heatmap, in accordance with an example implementation.

FIG. 7 illustrates an example deployment procedure of the sensor devices to acquire position information for generating an acoustic heatmap, in accordance with an example implementation. At 700, the sensor devices are deployed on the field site according to user preference, while observing guidelines for acoustic communication distance (e.g., approximately 20 to 30 meters max for an example involving ultrasonic waves with spread spectrum), and the sensor devices are then powered up in order (e.g., according to their sensor ID, in response to a broadcasted power on command). At 701, all of the sensors devices connect to a GW, and provide their sensor IDs to server 103 as described with respect to the flow of FIG. 5. At this junction, the server 103 has a list of deployed sensor IDs, and sends a control command to cause each sensor device that have not broadcasted yet to simultaneously broadcast acoustic/radio waves at 702. Each sensor device which receives the command broadcasts acoustic and radio wave signals simultaneously at 703, as described with respect to FIG. 5. At 704, the sensor devices which receive both of the wave signals through using its acoustic sensor, acoustic sensors array, and antenna radio (e.g., as illustrated in FIG. 4), calculates a distance and a direction through its MCU, and send to server 103 the distance, direction, tilt/orientation, and sensor ID information, as described in FIG. 5. At 705, the server pauses for a short duration (e.g., for 2 or 3 seconds). This pause is utilized to prevent communication interference caused by acoustic wave signals, which can provide time division multiple propagations. Steps 700-705 of the flow are be repeated until all the sensor devices have broadcasted acoustic wave and radio wave simultaneously as determined at 706. If not all sensor devices have broadcasted (No), the flow proceeds back to 702, otherwise (Yes), the flow proceeds to 707.

Once all the sensors broadcasts have been detected, the server 103 determines the distance vector table as illustrated in FIG. 6(*b*), with which the server can identify the sensor devices that have no acoustic connection with other devices at 707. If there is at least one sensor device which has no acoustic connection with other devices (No), the flow proceeds to 710 wherein the server 103 indicates to the browsing device 106 which of the sensor devices has no acoustic connection with other devices and therefore need to be relocated. The user can relocate the sensor device (e.g., move the sensor device to a new location or orientation within range to connect to another sensor device) and instruct the server 103 when the relocation is complete through browsing device 106, whereupon the flow can be reiterated at 702.

If all the sensor devices have at least one connection with other sensor devices (Yes), the server 103 calculates the relative position of each sensor device using distance, direction, tilt, and orientation information as gathered from each sensor device. Then, the server 103 derives the absolute position of all of the sensor devices at 709 based on a provision (e.g., by browsing device 106, by data from one of the sensor devices, etc.) of the specific position of one of the sensor devices (e.g., in (x, y, z) form by direct measurement, etc.).

Figure 8:
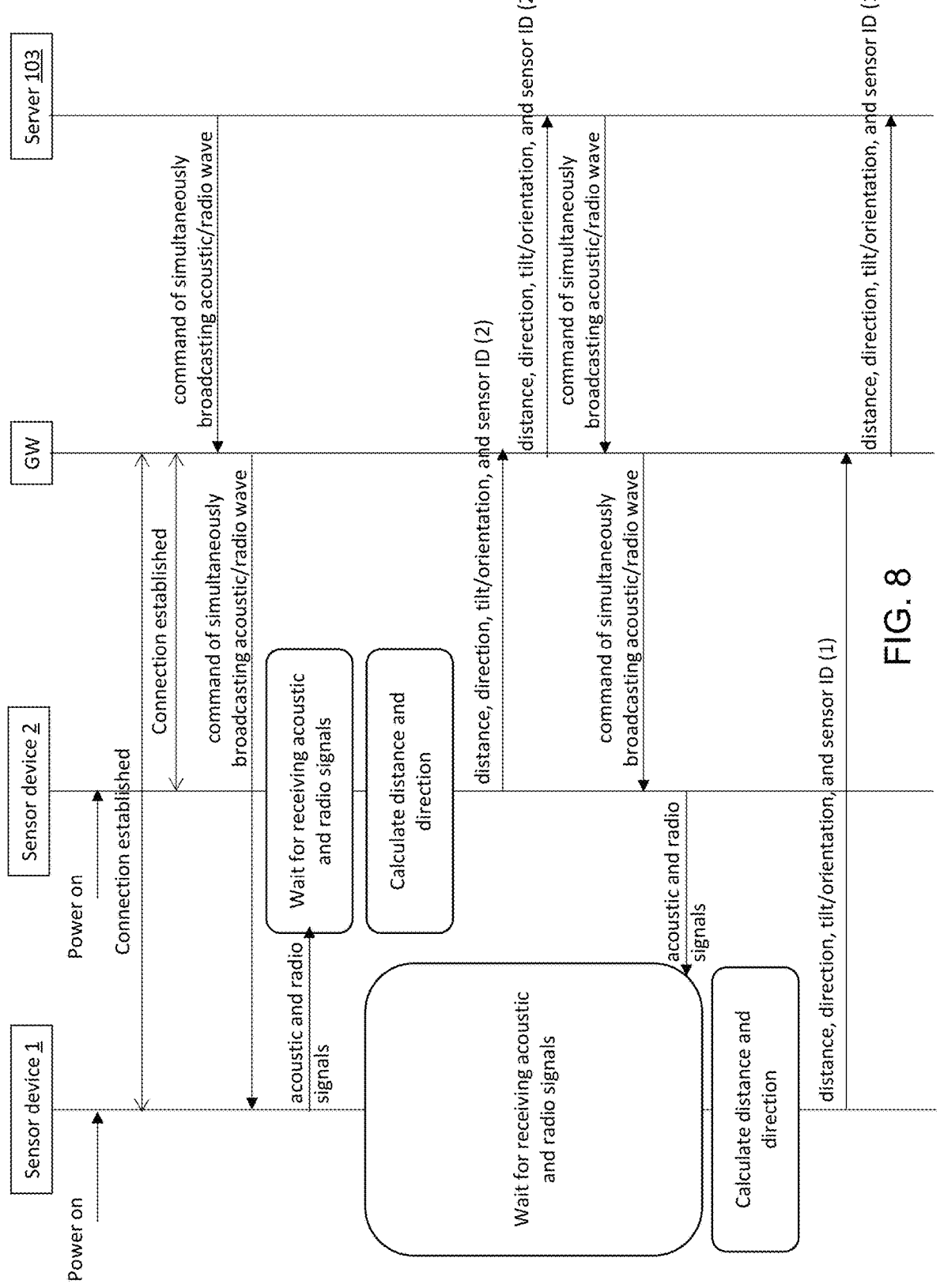
FIG. 8 illustrates an example of communication time procedure between sensor devices, gateways, and server based on the deployment procedure of FIG. 7.

FIG. 8 illustrates an example of communication time procedure between sensor devices, GWs, and server based on the deployment procedure of FIG. 7. Specifically, FIG. 8 illustrates an example iteration of the overall system in time order, regarding how and when each system element initiates its procedures from FIG. 7.

Figure 9:
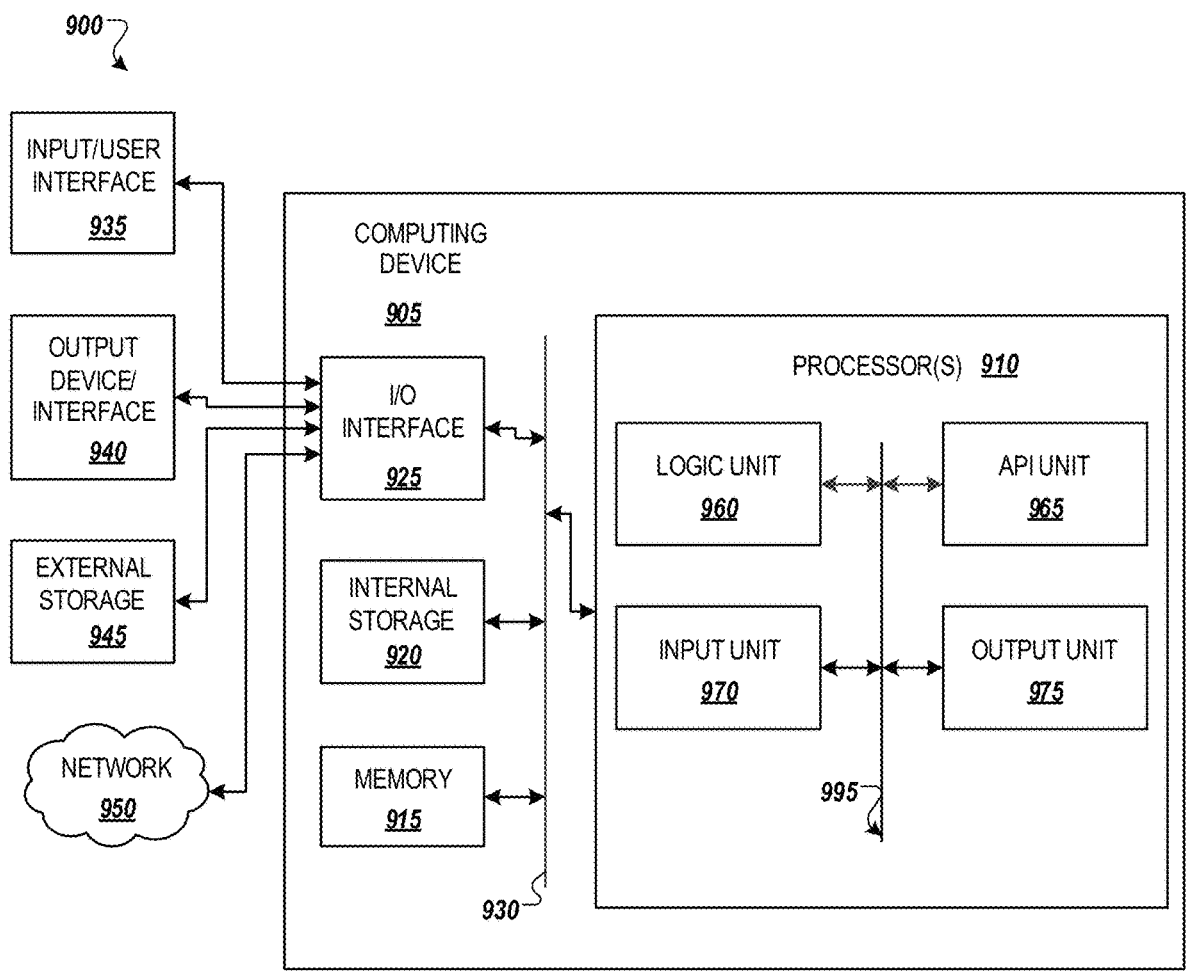
FIG. 9 illustrates an example computing environment with an example computer device suitable for use in some example implementations.

FIG. 9 illustrates an example computing environment with an example computer device suitable for use in some example implementations, such as for facilitating functionality for the server 103 and/or browsing device 106 as illustrated in FIG. 1.

Computer device 905 in computing environment 900 can include one or more processing units, cores, or processors 910, memory 915 (e.g., RAM, ROM, and/or the like), internal storage 920 (e.g., magnetic, optical, solid state storage, and/or organic), and/or I/O interface 925, any of which can be coupled on a communication mechanism or bus 930 for communicating information or embedded in the computer device 905. I/O interface 925 is also configured to receive images from cameras or provide images to projectors or displays, depending on the desired implementation.

Computer device 905 can be communicatively coupled to input/user interface 935 and output device/interface 940. Either one or both of input/user interface 935 and output device/interface 940 can be a wired or wireless interface and can be detachable. Input/user interface 935 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 940 may include a display, television, monitor, printer, speaker, braille, or the like. In some example implementations, input/user interface 935 and output device/interface 940 can be embedded with or physically coupled to the computer device 905. In other example implementations, other computer devices may function as or provide the functions of input/user interface 935 and output device/interface 940 for a computer device 905.

Examples of computer device 905 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 905 can be communicatively coupled (e.g., via I/O interface 925) to external storage 945 and network 950 for communicating with any number of networked components, devices, and systems, including one or more computer devices of the same or different configuration. Computer device 905 or any connected computer device can be functioning as, providing services of, or referred to as a server, client, thin server, general machine, special-purpose machine, or another label.

I/O interface 925 can include, but is not limited to, wired and/or wireless interfaces using any communication or I/O protocols or standards (e.g., Ethernet, 802.11x, Universal System Bus, WiMax, modem, a cellular network protocol, and the like) for communicating information to and/or from at least all the connected components, devices, and network in computing environment 900. Network 950 can be any network or combination of networks (e.g., the Internet, local area network, wide area network, a telephonic network, a cellular network, satellite network, and the like).

Computer device 905 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 905 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C #, Java, Visual Basic, Python, Perl, JavaScript, and others).

Processor(s) 910 can execute under any operating system (OS) (not shown), in a native or virtual environment. One or more applications can be deployed that include logic unit 960, application programming interface (API) unit 965, input unit 970, output unit 975, and inter-unit communication mechanism 995 for the different units to communicate with each other, with the OS, and with other applications (not shown). The described units and elements can be varied in design, function, configuration, or implementation and are not limited to the descriptions provided.

In some example implementations, when information or an execution instruction is received by API unit 965, it may be communicated to one or more other units (e.g., logic unit 960, input unit 970, output unit 975). In some instances, logic unit 960 may be configured to control the information flow among the units and direct the services provided by API unit 965, input unit 970, output unit 975, in some example implementations described above. For example, the flow of one or more processes or implementations may be controlled by logic unit 960 alone or in conjunction with API unit 965. The input unit 970 may be configured to obtain input for the calculations described in the example implementations, and the output unit 975 may be configured to provide output based on the calculations described in example implementations.

In example implementations, Processor(s) 910 can be configured to execute the flow diagrams as illustrated in FIGS. 7 and 8 and can be configured to transmit a command to the plurality of devices to simultaneously broadcast an acoustic wave signal and a radio wave signal as described with respect to FIGS. 4, 5 and 7; receive information regarding detected acoustic wave signals and detected radio wave signals, and 3-dimensional magnetometer measurements from each of the plurality of devices as described with respect to FIG. 7; and for the information indicative of each of the plurality of devices having at least one acoustic connection with another one of the plurality of devices, determining a position for each of the plurality of devices as described with respect to FIG. 6(b) and FIG. 7.

In example implementations, it may be that not all of the devices received the command to broadcast the acoustic wave signal and the radio wave signal. Processor(s) 910 can be configured to determine such situations based on identifying which devices did not transmit their information regarding detected acoustic wave signals and radio wave signals and/or not receiving an acknowledgement to the issued command, depending on the desired implementation. Thus, processor(s) 910 can be configured to, for ones of the plurality of devices not simultaneously broadcasting the acoustic wave signal and the radio wave signal in response to the command, retransmit the command to the ones of the plurality of devices as described in FIG. 7.

Figure 6A:
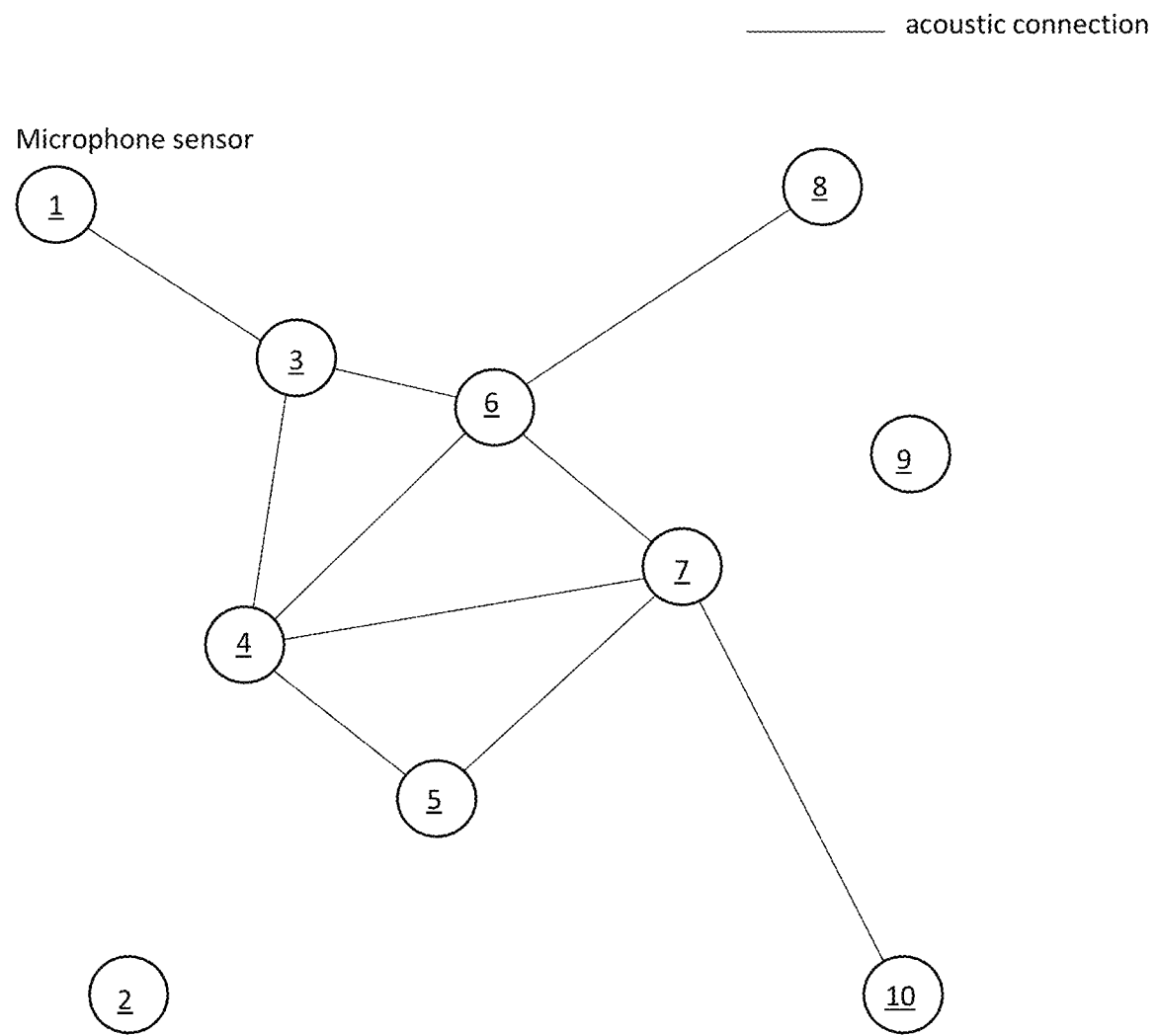

In example implementations, it is possible for sensor devices to be positioned at a location where they cannot be acoustically connected to any other sensor device as illustrated in FIG. 6(a). Thus, processor(s) 910 can detect such a situation from the distance vector table of FIG. 6(b) and can be configured to indicate the one or more of the plurality of devices not having at least one acoustic connection with another one of the plurality of devices for relocation as described in FIG. 7.

In example implementations, acoustic heatmaps as illustrated in FIGS. 2 and 3 can be generated based on the determined positions of each of the plurality of devices by processor(s) 910. Processor(s) 910 can refer to distance vector table FIG. 6(b) and generate a heatmap based on the number of vectors between sensor devices, or through other methods in accordance with the desired implementation.

In example implementations, and as described in FIG. 7, processor(s) 910 can be configured to determine the position for each of the plurality of devices by calculating a relative position of the each of the plurality of devices based on the 3-dimensional magnetometer measurements, and distance information and direction information from the information regarding the detected acoustic wave signals and the detected radio wave signals and deriving absolute positions for the plurality of devices based on the calculation of the relative position.

In example implementations, and as described in FIG. 7, processor(s) 910 can be configured to pause before transmission of the command based on a setting. The setting can be preset (e.g., 2-3 seconds) or calculated through any desired implementation.

Memory 915 can be configured to manage information received from the plurality of sensor devices, such as distance and direction between sensor devices, tilt and orientation measurements from 3-dimensional magnetometers and accelerometers, and depending on the desired implementation, data regarding acoustic signals and radio wave signals. From such information, memory 915 can be configured to store information regarding the acoustic connections between sensor devices as illustrated in FIGS. 6(a) and 6(b), and acoustic heatmaps as illustrated in FIGS. 2 and 3. Depending on the desired implementation, such information can also be stored in the data lake 104.

Figure 10:
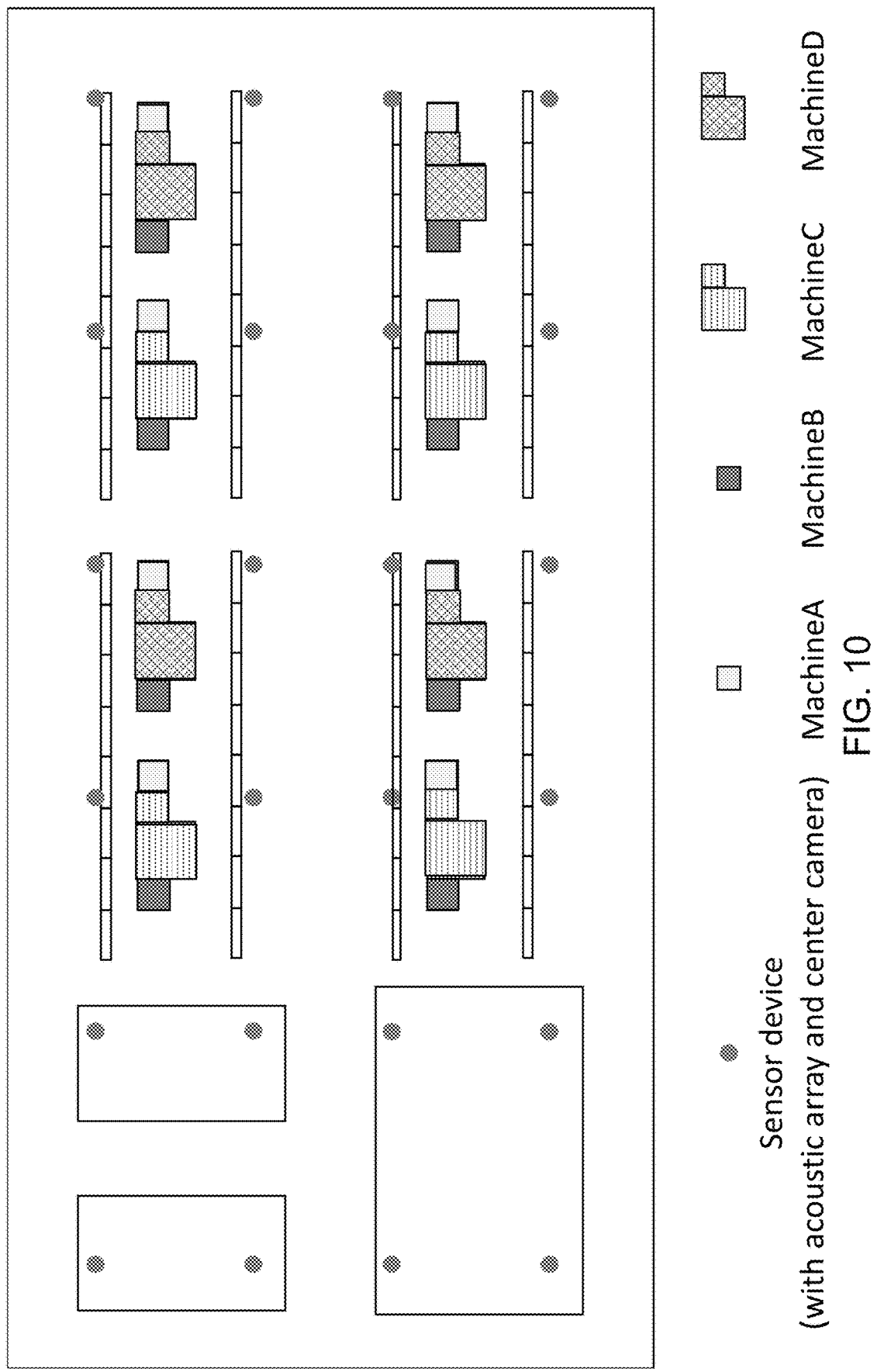
FIG. 10 illustrates an example of application where sensor devices are assumed to be deployed in arbitrary arrangement in the factory shop floor to facilitate condition monitoring of assets, in accordance with an example implementation.

In example applications, and as illustrated in FIG. 10, sensor devices are assumed to be deployed in an arbitrary arrangement in the factory shop floor to cover overall shop floor. In this application, the positions of the assets (e.g., processing machines) in the shop floor are known by, for example, cameras installed on sensor devices, wireless communications, ultrasonic wave utilization, direct measurement, utilizing a drawing of the shop floor, and so on in accordance with the desired implementation. The asset positions are converted into a relative position from the sensor devices' viewpoint in order to identify the direction where they turn the beams in their fields of acoustic vision. As a result, the acoustic sensor arrays of sensor devices become able to make their focuses on the assets which users want to investigate. Accordingly, this approach can facilitate various analytics such as machine condition classification (monitoring), machine diagnosis, dictation recognition using the state-of-the-art artificial intelligence (AI)/machine learning technologies using extremely low noise acoustic data.

Figure 11:
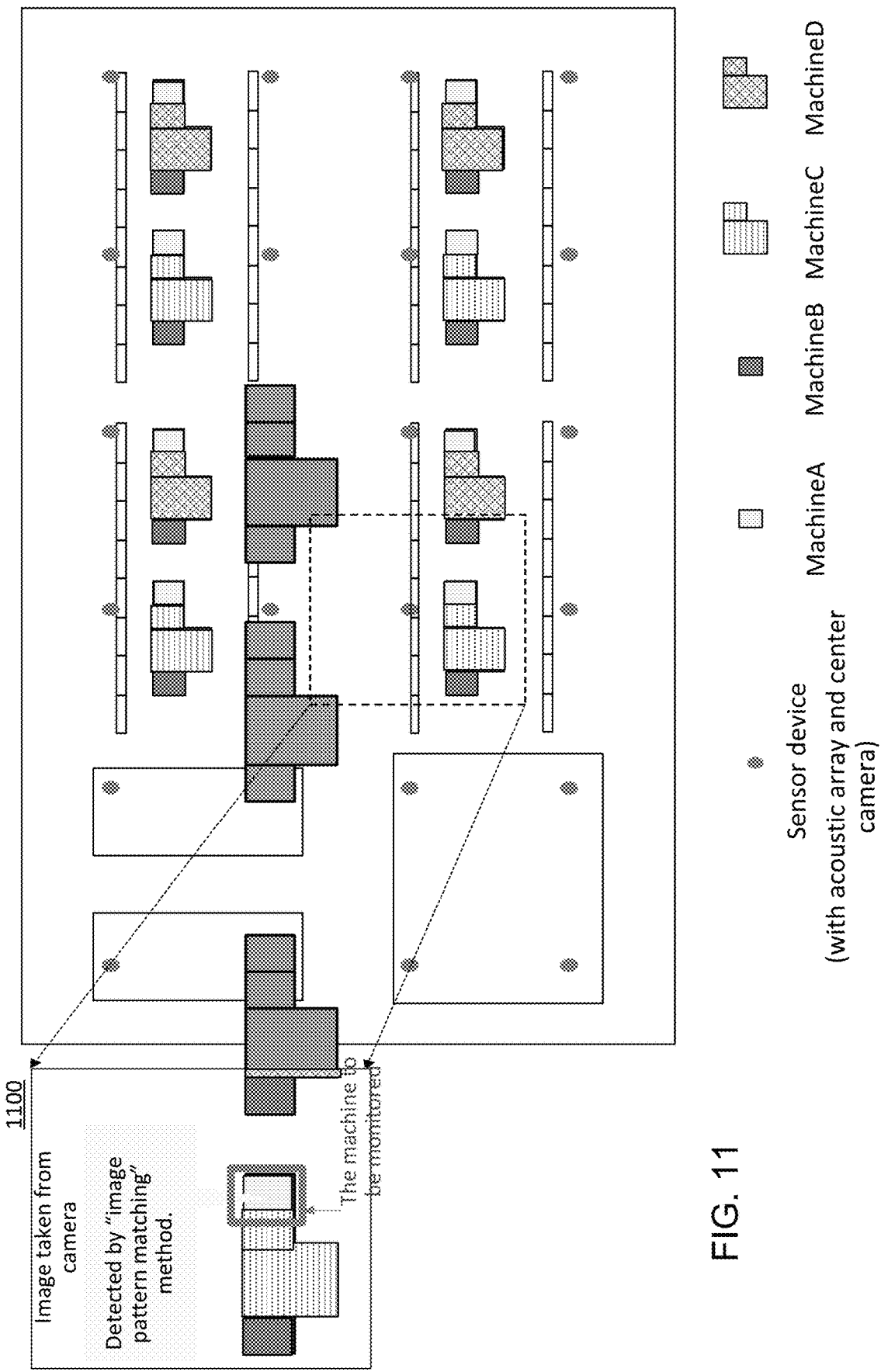
FIG. 11 illustrates an example of the same application as FIG. 10 in the case of using cameras for position information of assets, in accordance with an example implementation.
Figure 12:
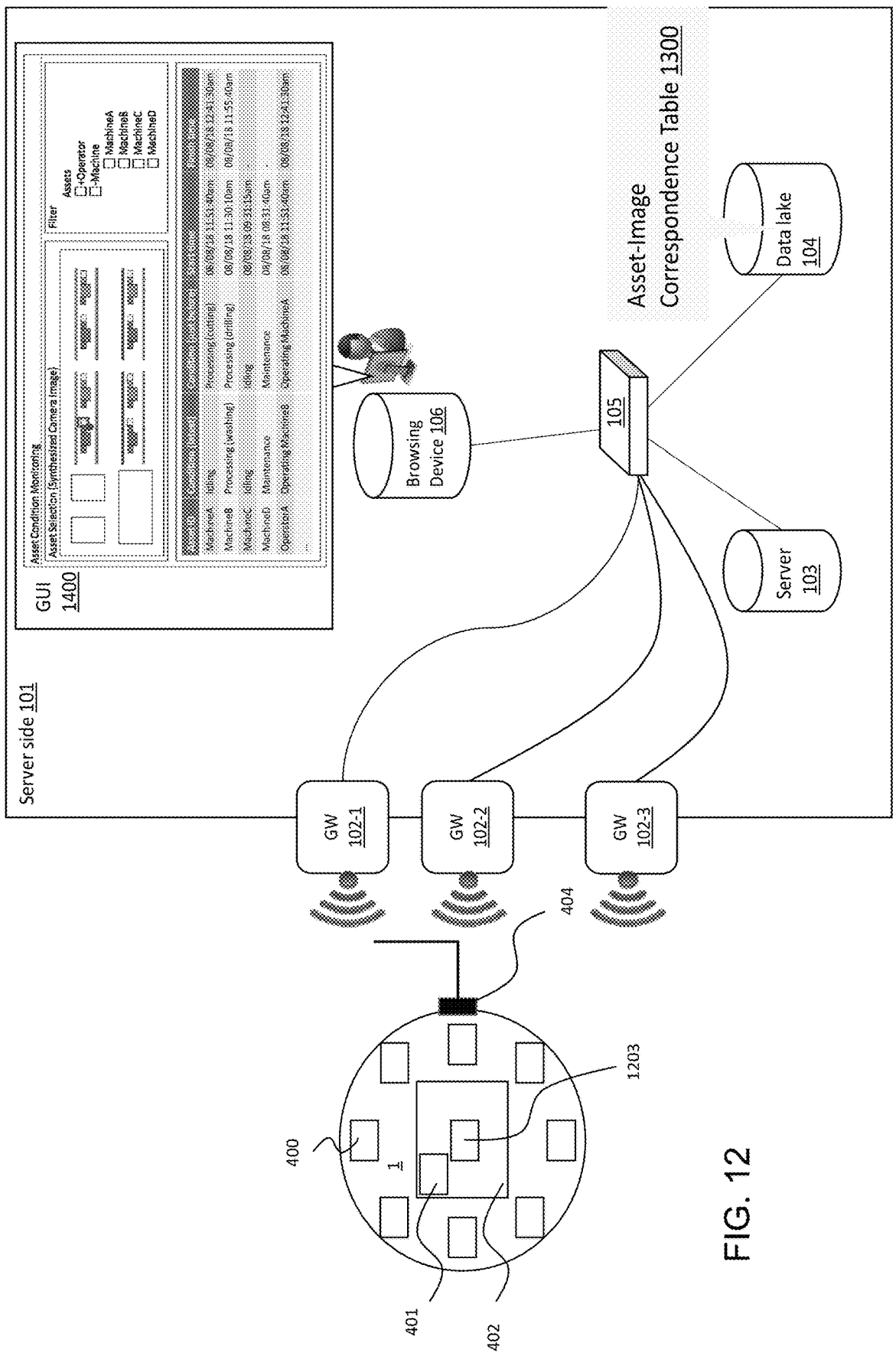
FIG. 12 illustrates an example of system architecture for an industrial IoT sensing system, especially in accordance with an example implementation of the application described in FIG. 11.
Figure 13:
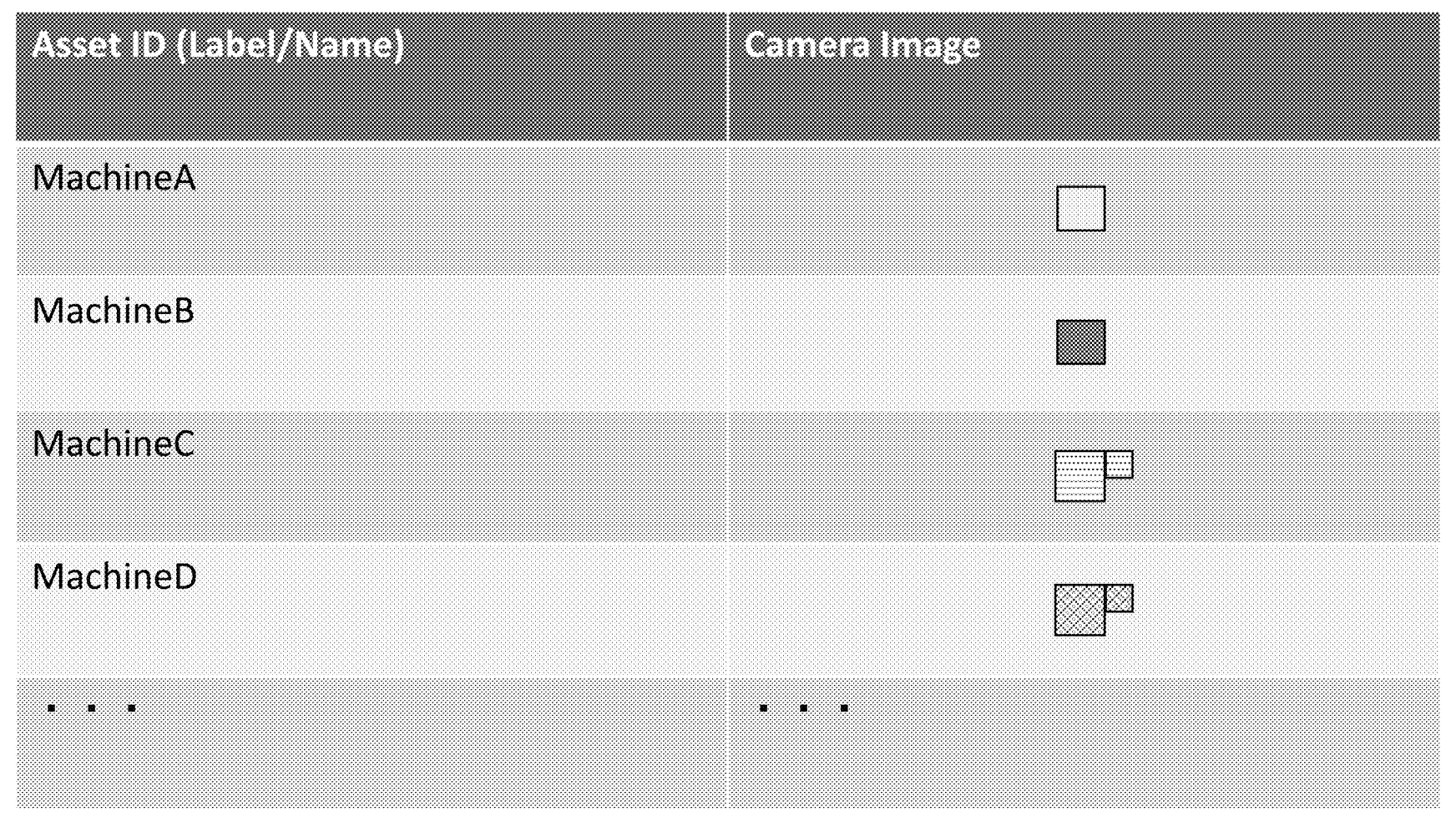

In example implementations, and as illustrated in FIGS. 11, 12, and 13, a video camera 1203 installed on sensor devices can be used in the manner described above. FIG. 11 illustrates an example of overall diagram of shop floor with an assignment of assets such as machine A, B, C, and D. Further, sensor devices having an acoustic array and a center camera 1203 are shown, whose deployment positions can be arbitrary. In FIG. 11, the sensor devices are deployed in grid type manner for simpler explanation.

In using the camera 1203 to identify the position of the assets which the user wants to investigate, two conversions are required; 1. "pixel position of the assets" to "beam direction of acoustic microphone array" (as some example formats, calibration table of sensor or mathematical formulation would be possible), 2. "asset images" to "pixel position of the assets". The first one is to make beams of microphone arrays direct to the assets, where calibration of the direction between camera and microphone array is required. On the other hand, common image recognition technologies can facilitate establishing the conversion of asset images to pixel positions, once the "asset-image correspondence table" 1300 is prepared in advance.

In FIG. 12, an example of a system diagram which facilitates the application is shown, wherein the camera 1203 is installed in the center of the sensor devices and "asset-image correspondence table" 1300 is inside the data lake 104 (graphical user interface (GUI) 1400 is also shown).

FIG. 13 shows an example of "Asset-Image correspondence table" 1300 which converts camera images as shown in camera image 1100 of FIG. 11 into asset IDs (or labels or names or so).

Figure 14:
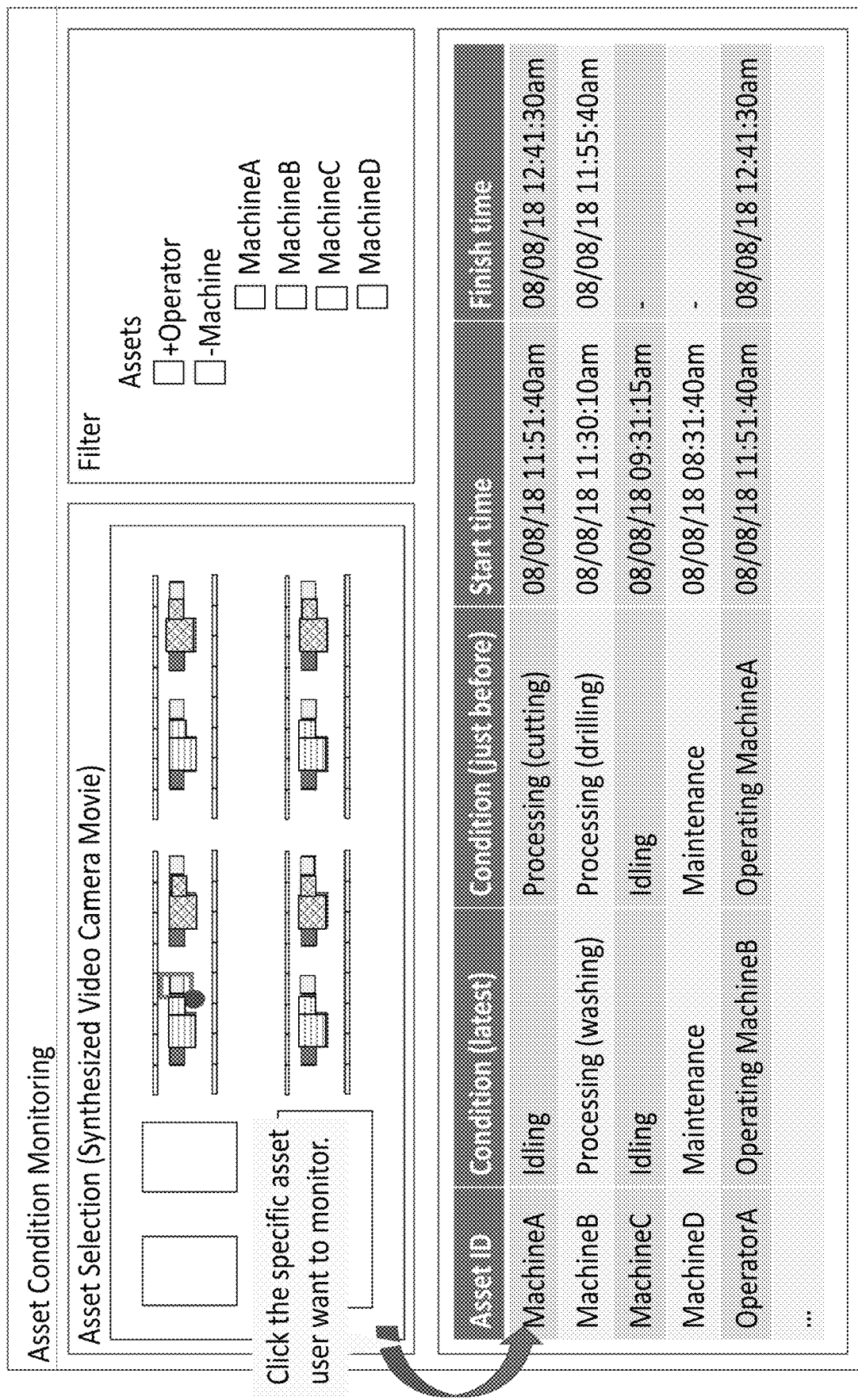
FIG. 14 illustrates an example of a graphical user interface (GUI) in accordance with an example implementation of application described in FIG. 11, in accordance with an example implementation.

In example implementations, and as described in FIG. 14, GUI 1400 can support the uses to indicate assets which they want to investigate using filter field, and select the exact position of the asset using the asset selection field where the overall shop floor diagram is shown. In the GUI for asset condition monitoring shown in FIG. 14, once users indicate the asset which they want to investigate, analyzed/processed results are shown in the table in the bottom portion of the GUI.

In example implementations, there is an application that involves establishing beamforming functionality on the device as described in FIGS. 4 and 12, using the system as described in FIG. 12, the algorithms as described in FIGS. 5, 7 and 8, and the position information of the assets managed by the systems. The application further involves converting position information of assets into the beamforming direction; and facilitating acoustic condition monitoring of assets with AI or machine learning techniques.

When such devices also have video cameras installed therein as illustrated in FIG. 12, the application can also involve an managing in a data lake asset-image correspondence table which shows the correspondence between asset images prepared in advance and asset ID by which users can identify the assets as illustrated in FIG. 13; converting asset images prepared in advance to pixel position of the assets in the video camera with image recognition technique, and converting pixel position of the assets to beam direction of acoustic microphone array.

Such example implementations further involve a GUI which shows for an asset a selection field of a synthesized video camera movie, a filter field, and a table field showing the analyzed results of the asset, and provides selection and filter functionalities of assets or groups of assets through input to the movie (e.g., a click or tap) and through the input in the filter field (e.g., checked boxes).

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A device configured to calculate direction of arrival (DOA) of acoustic waves and facilitate beamforming functionalities, comprising:
   an array of acoustic sensors configured to detect acoustic wave signals;
   a 3-dimensional accelerometer and magnetometer;
   an antenna configured to transmit and receive radio wave signals;
   an acoustic speaker configured to transmit acoustic wave signals; and
   a processor, configured to:
      simultaneously transmit an acoustic wave signal from the acoustic speaker and a radio wave signal from the antenna;
      detect another acoustic wave signal from the array of acoustic sensors and another radio wave signals from the antenna;
      determine a distance and a direction to another device that transmitted the another acoustic wave signal and the another radio wave signal based on an arrival difference between the another acoustic wave signal and the another radio wave signal; and
      transmit, to a gateway, the determined distance and the determined direction, and measurements from the 3-dimensional accelerometer and magnetometer.

2. The device of claim 1, wherein the measurements from the 3-dimensional accelerometer and magnetometer comprises orientation measurements of the device, and wherein the processor is configured to transmit tilt measurements of the device to the gateway.

3. The device of claim 1, wherein the processor is configured to simultaneously transmit the acoustic wave signal from the acoustic speaker and the radio wave signal from the antenna in response to a command received from the gateway.

4. The device of claim 1, wherein when the device is powered on, the processor is configured to:
   connect to the gateway; and
   transmit the device identifier to the gateway.

5. A system, comprising:
   a plurality of devices configured to calculate direction of arrival (DOA) of acoustic waves and facilitate beamforming functionalities; and
   a server configured to interact with the plurality of devices, the server comprising:
      a processor configured to:
      transmit a command to the plurality of devices to simultaneously broadcast an acoustic wave signal and a radio wave signal;
      receive information regarding detected acoustic wave signals and detected radio wave signals, and 3-dimensional accelerometer and magnetometer measurements from each of the plurality of devices; and
      for the information indicative of each of the plurality of devices having at least one acoustic connection with another one of the plurality of devices, determine a position for each of the plurality of devices.

6. The system of claim 5, wherein for ones of the plurality of devices not simultaneously broadcasting the acoustic wave signal and the radio wave signal in response to the command, the processor is configured to retransmit the command to the ones of the plurality of devices.

7. The system of claim 5, wherein for the information indicative of one or more of the plurality devices not having at least one acoustic connection with another one of the plurality of devices, the processor is configured to indicate the one or more of the plurality of devices not having at least one acoustic connection with another one of the plurality of devices for relocation.

8. The system of claim 5, wherein the processor is configured to generate an acoustic heatmap based on the determined position for the each of the plurality of devices.

9. The system of claim 5, wherein the processor is configured to determine the position for each of the plurality of devices through a calculation of a relative position of the each of the plurality of devices based on the 3-dimensional accelerometer and magnetometer measurements, and distance information and direction information from the information regarding the detected acoustic wave signals and the detected radio wave signals and a derivation of absolute positions for the plurality of devices based on the calculation of the relative position.

10. The system of claim 5, wherein the processor is configured to conduct a pause before transmission of the command based on a setting.

11. A method, comprising:
   transmitting a command to the plurality of devices to simultaneously broadcast an acoustic wave signal and a radio wave signal;
   receiving information regarding detected acoustic wave signals and detected radio wave signals, and 3-dimensional accelerometer and magnetometer measurements from each of the plurality of devices; and
   for the information indicative of each of the plurality of devices having at least one acoustic connection with another one of the plurality of devices, determining a position for each of the plurality of devices.

12. The method of claim 11, further comprising, for ones of the plurality of devices not simultaneously broadcasting the acoustic wave signal and the radio wave signal in response to the command, retransmitting the command to the ones of the plurality of devices.

13. The method of claim 11, further comprising, for the information indicative of one or more of the plurality devices not having at least one acoustic connection with another one of the plurality of devices, indicating the one or more of the plurality of devices not having at least one acoustic connection with another one of the plurality of devices for relocation.

14. The method of claim 11, further comprising generating an acoustic heatmap based on the determined position for the each of the plurality of devices.

15. The method of claim 11, wherein the determining the position for each of the plurality of devices comprises:
    calculating a relative position of the each of the plurality of devices based on the 3-dimensional accelerometer and magnetometer measurements, and distance information and direction information from the information regarding the detected acoustic wave signals and the detected radio wave signals and
    deriving absolute positions for the plurality of devices based on the calculation of the relative position.

16. The method of claim 11, further comprising pausing before transmission of the command based on a setting.

17. The method of claim 11 comprising,
    establishing beamforming functionality on the each of the plurality of devices from the transmitting a command to the plurality of devices to simultaneously broadcast an acoustic wave signal and a radio wave signal, the receiving of the information regarding detected acoustic wave signals and detected radio wave signals, the 3-dimensional accelerometer and magnetometer measurements from each of the plurality of devices; and the position for the each of the plurality of devices,
    establishing position information of assets;
    converting the position information of the assets into a direction of beamforming; and
    facilitating acoustic condition monitoring of assets through at least one of artificial intelligence or machine learning methods.

18. The method of claim 17, wherein each of the plurality of devices comprises a video camera and an acoustic microphone array, the method further comprising:
    managing in a data lake, an asset-image correspondence table which shows the correspondence between asset images and an asset identifier (ID);
    converting asset images to pixel positions of the assets in the video camera through image recognition,
    converting the pixel positions of the assets to a beam direction of the acoustic microphone array; and
    providing a graphical user interface (GUI) configured to:
    show for each of the assets, a selection field for providing a synthesized video camera movie, a filter field, and a table field showing the analyzed results of each assets, and
    provide selection and filter functionalities of the assets or groups of assets through input received on the movie and the filter field.

* * * * *